United States Patent [19]
Dautartas et al.

[11] Patent Number: 6,037,268
[45] Date of Patent: Mar. 14, 2000

[54] METHOD FOR ETCHING TANTALUM OXIDE

[75] Inventors: Mindaugas Fernand Dautartas, Alburtis, Pa.; Ofer Sneh, Branchburg, N.J.

[73] Assignee: Lucent Technologies Inc., Murray Hill, N.J.

[21] Appl. No.: 09/222,505

[22] Filed: Dec. 29, 1998

[51] Int. Cl.[7] .................................. C23F 1/00; C23F 1/12
[52] U.S. Cl. ........................ 438/736; 438/717; 216/24; 216/51
[58] Field of Search .................... 216/24, 51, 58, 216/63, 79; 438/717, 735, 736

[56] References Cited

U.S. PATENT DOCUMENTS

| | | | |
|---|---|---|---|
| 5,032,220 | 7/1991 | Yamamoto et al. | 156/643 |
| 5,254,202 | 10/1993 | Kaplan | 156/345 |
| 5,637,153 | 6/1997 | Niino et al. | 134/22.11 |

FOREIGN PATENT DOCUMENTS 889506  1/1999  Germany.

*Primary Examiner*—Bruce Breneman
*Assistant Examiner*—Alva C Powell
*Attorney, Agent, or Firm*—Lester H. Birnbaum

[57] ABSTRACT

The invention is a method of fabricating a device which includes the step of etching a layer of tantalum oxide or niobium oxide. A material comprising chlorine and a material comprising oxygen are applied to the layer and energy is added to the layer in the form of heat or ion bombardment.

10 Claims, 2 Drawing Sheets

METHOD FOR ETCHING TANTALUM OXIDE

FIELD OF THE INVENTION

This invention relates to the fabrication of optical and electronic devices, and in particular to a method for etching tantalum oxide as part of the fabrication of such devices.

BACKGROUND OF THE INVENTION

Tantalum oxide ($Ta_2O_5$) is often used in the fabrication of optical devices and integrated circuits. For example, tantalum oxide can be used as a mask for etching silicon dioxide ($SiO_2$) in order to define waveguides in a silicon substrate. In a typical oxide etching operation, fluorine etchants are usually preferred. However, for tantalum oxide, fluorine etchants tend to be fairly slow and have low selectivity to photoresist and $SiO_2$. Therefore, it is desirable to provide a faster and more selective etching process.

SUMMARY OF THE INVENTION

The invention is a method of fabricating a device including the step of etching a layer of material selected from the group consisting of tantalum oxide and niobium oxide. A material comprising chlorine and a material comprising oxygen are applied to the oxide layer and energy is added to the layer. In one embodiment, the materials are $TaCl_5$ and $H_2O$ and the layer is heated to a temperature greater than 300 degC. In another embodiment, the materials are chlorine and oxygen gases, and the layer is etched by reactive ion etching.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
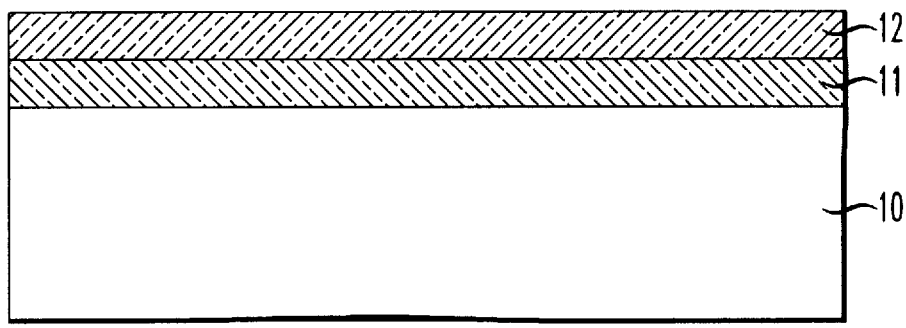
FIGS. 1–6 are cross sectional views of a device in various stage of fabrication in accordance with an embodiment of the invention.

In a typical application of the invention, as illustrated in FIG. 1, a silicon substrate, 10, is coated with a first dielectric layer, 11, such as undoped silicon dioxide. The layer, 11, is typically deposited by standard chemical vapor deposition or flame hydrolysis techniques to a thickness of approx. 20 microns. Deposited over the first layer, 11, is a second dielectric layer, 12, which in this example is a germanium-doped or phosphorous-doped silicon dioxide layer. The layer, 12, is also deposited by standard techniques usually to a thickness of 6–7 microns.

Figure 2:
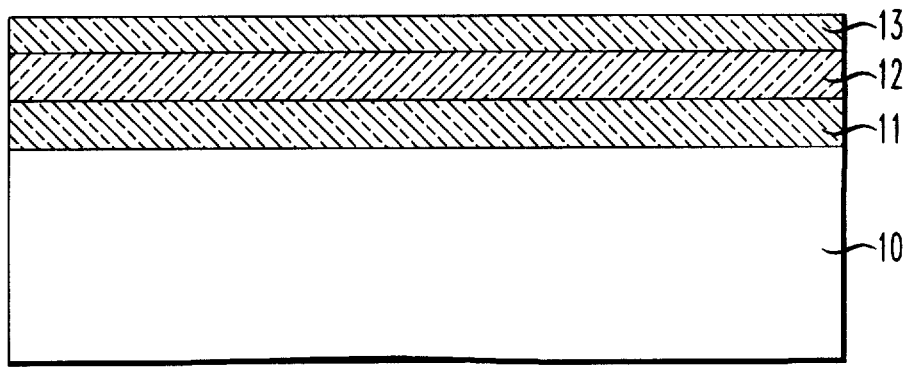

Next, as illustrated in FIG. 2, a layer, 13, comprising Tantalum Oxide ($Ta_2O_5$) is deposited over the silicon dioxide layer, 12. The layer, 13, can be deposited by atomic layer deposition, sputtering, chemical vapor deposition or plasma enhanced chemical vapor deposition usually to a thickness within the range 50 angstroms to 0.5 microns. The thickness of this layer will depend on the the etch selectivity with respect to the silicon dioxide layer, 12, and the minimum thickness producing uniform and continuous coverage by the type of deposition employed.

Figure 3:
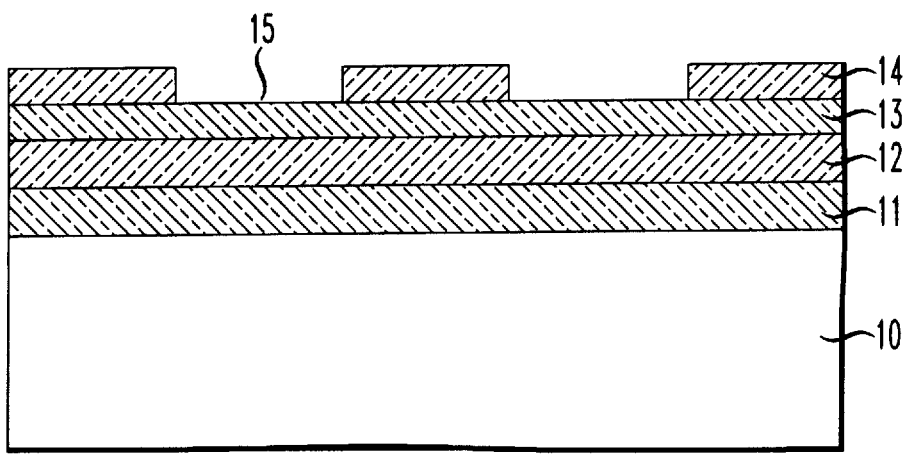

As illustrated in FIG. 3, a layer of photoresist, 14, is coated on the tantalum oxide layer, 13, by standard techniques. The photoresist is exposed through a mask (not shown) and developed by standard photolithographic techniques in order to define apertures, e.g., 15, over the areas of the substrate, 10, which will define the boundaries of the waveguides.

Figure 4:
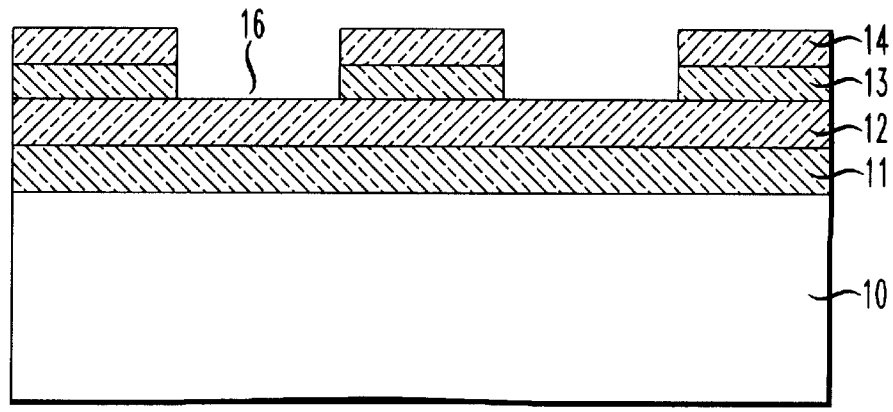

The exposed portions of the tantalum oxide layer, 13, are then etched as illustrated in FIG. 4. Applicants have discovered that under certain conditions, a mixture of chlorine and oxygen can be used to etch the tantalum oxide. For example, a mixture of $TaCl_5$ and $H_2O$ under normal conditions will deposit thin films of $Ta_2O_5$. However, when sufficient energy is added to the surface of the layer, 13, the $Ta_2O_5$ will be etched. While not being bound by any theory, it is believed that a species comprising $Ta_xO_yCl_z$ is formed by the reaction of chlorine and oxygen with the tantalum oxide layer, 13. This species is apparently not volatile until sufficient energy is added. In particular, the energy may be added by heating the structure to a temperature of at least 300 degC.

Thus, in accordance with one embodiment of the invention, $TaCl_5$ and $H_2O$ are applied to the surface of the exposed portions of layer 13 while heating to a temperature of at least 300 degC. until the layer is etched through, resulting in the formation of a window, 16, in the layer, 13. Anticipated etch rates are in the range 200 to 5000 A/min. If an anisotropic and/or lower-temperature etch is desired, the energy can be applied by bombardment of ions as in a Reactive Ion Etch (RIE). As known in the art, RIE involves introducing gases in a chamber including the structure to be etched and applying an RF signal to electrodes to form a plasma. In this embodiment, a chlorine gas ($Cl_2$) or other source of chlorine such as a chlorocarbon can be mixed with oxygen gas ($O_2$) or other source of oxygen such as NO or $N_2O$ in the chamber to provide the etching with etch rates in the range 500 to 5000 A/min. In this case, the etching is preferably anisotropic which is desired to maintain the critical dimensions throughout the entire etch process.

Figure 5:
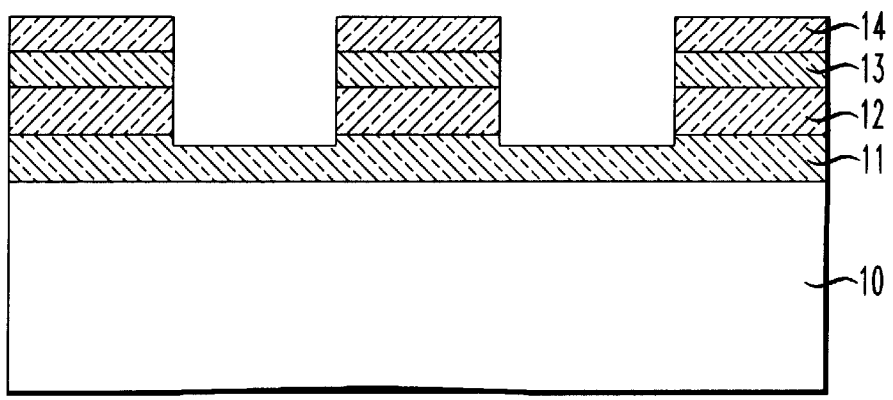

Next, as illustrated in FIG. 5, the doped silicon oxide layer, 12, is etched through using the tantalum oxide layer, 13, as a hard mask. In this example, the photoresist, 14, remains on the surface of the tantalum oxide layer during etching, but, alternatively, the photoresist can be removed prior to this etching step. A Fluorine RIE chemistry may be used to etch layer, 12, whether the photoresist is present or not, since the fluorine chemistry will tend to etch the silicon dioxide much faster than the tantalum oxide resulting in a highly selective process. A RIE process applying, e.g., $CHF_3$—$O_2$ can be employed. Typically, the layer, 12, is etched to delineate the core waveguide structure and a small portion of the underlying layer, 11, is also etched.

Figure 6:
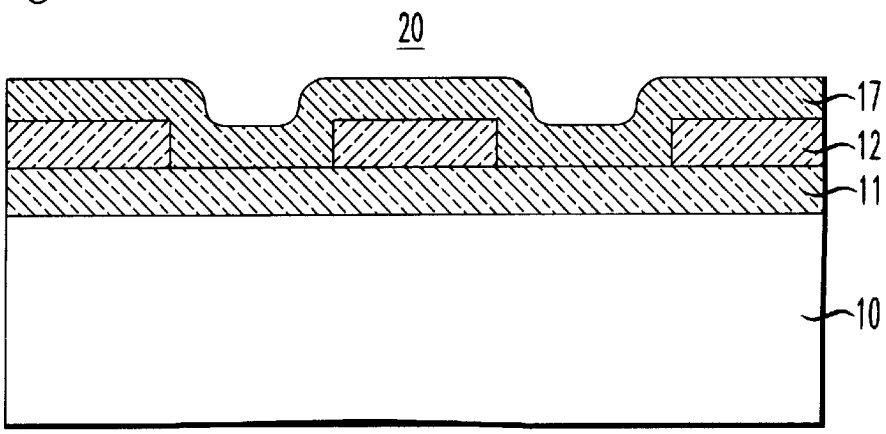

The tantalum oxide layer, 13, and the photoresist layer, 14, if still present. are then removed. The photoresist is removed by standard stripping operations. The $Ta_2O_5$ is removed using the same type of etch employed above for selective etching of the $Ta_2O_5$ layer. Next, as illustrated in FIG. 6, a layer, 17, usually comprising a lightly doped silicon dioxide layer, is deposited over the resulting structure in order to define the waveguides, e.g., 20. The waveguides comprise an upper cladding formed from the layer, 17, a core formed from the layer 12, and a lower cladding formed from the layer, 11.

While the invention has been described with reference to the formation of waveguides, it will be appreciated that it may be utilized to form other structures requiring a submicron IC feature delineation, such as DRAM capacitors. In this case the delineated $Ta_2O_5$ features are employed as a DRAM capacitor dielectric layer and are part of the device structure. The fast and selective etch process allows thinner layer of photoresist to be used which improves on critical dimensions definition. Better critical dimensions are desirable for submicron applications. Further, although etching of tantalum oxide has been described, the invention may also be useful for etching other dielectrics such as niobium oxide.

What is claimed is:

1. A method for fabricating a device including etching a first layer comprising a first material selected from the group consisting of tantalum oxide and niobium oxide comprising the step of applying to said layer a second material comprising chlorine and a third material comprising oxygen while supplying energy to the layer.

2. The method according to claim 1 wherein the energy is added by heating the layer to a temperature of at least 300 degC.

3. The method according to claim 2 wherein the second material comprises $TaCl_5$ and the third material comprises $H_2O$.

4. The method according to claim 1 wherein the energy is supplied by ion bombardment during a reactive ion etching of the layer.

5. The method according to claim 4 wherein the second material comprises a gas selected from the group consisting of chlorine and chlorocarbon, and the third material comprises oxygen gas.

6. The method according to claim 1 wherein the layer is selectively etched.

7. The method according to claim 6 wherein the layer is used as a hard mask for forming an optical waveguide on a substrate.

8. The method according to claim 7 wherein the first layer is formed over a second layer, and subsequent to the selective etching, the second layer is etched in areas exposed by the first layer.

9. The method according to claim 8 wherein the second layer comprises silicon dioxide, and the second layer is etched by applying an etchant comprising fluorine.

10. The method according to claim 9 wherein the first layer is etched using a layer of photoresist, and the second layer is etched after removal of the photoresist.

* * * * *